United States Patent [19]
Liron

[11] Patent Number: 4,795,916
[45] Date of Patent: Jan. 3, 1989

[54] LOW POWER DIFFERENTIAL ECL LINE DRIVER

[75] Inventor: John E. Liron, Grass Valley, Calif.

[73] Assignee: The Grass Valley Group, Inc., Grass Valley, Calif.

[21] Appl. No.: 6,183

[22] Filed: Jan. 23, 1987

[51] Int. Cl.⁴ .................. H03K 5/22; H03K 19/086
[52] U.S. Cl. ............................ 307/270; 307/494; 307/355; 330/254
[58] Field of Search .............. 307/455, 467, 296 R, 307/270, 255, 355, 494; 330/254

[56] References Cited

U.S. PATENT DOCUMENTS

| | | | |
|---|---|---|---|
| 3,452,289 | 6/1969 | Ryan | 330/254 |
| 3,523,194 | 3/1967 | Sheng | 307/455 |
| 3,757,240 | 9/1973 | Fogg | 330/254 |
| 4,551,638 | 11/1985 | Varadarajan | 307/270 |
| 4,633,104 | 12/1986 | Mallinson | 307/467 |
| 4,663,544 | 5/1987 | Flora et al. | 307/455 |

Primary Examiner—John S. Heyman
Assistant Examiner—Nancy Thai
Attorney, Agent, or Firm—Norman E. Brunell; Francis I. Gray

[57] ABSTRACT

A low power, differential ECL line driver has a switching network that applies a constant current source as the emitter load to only one of the output transistors at a time while applying a constant current source to the base of the other output transistor.

6 Claims, 1 Drawing Sheet

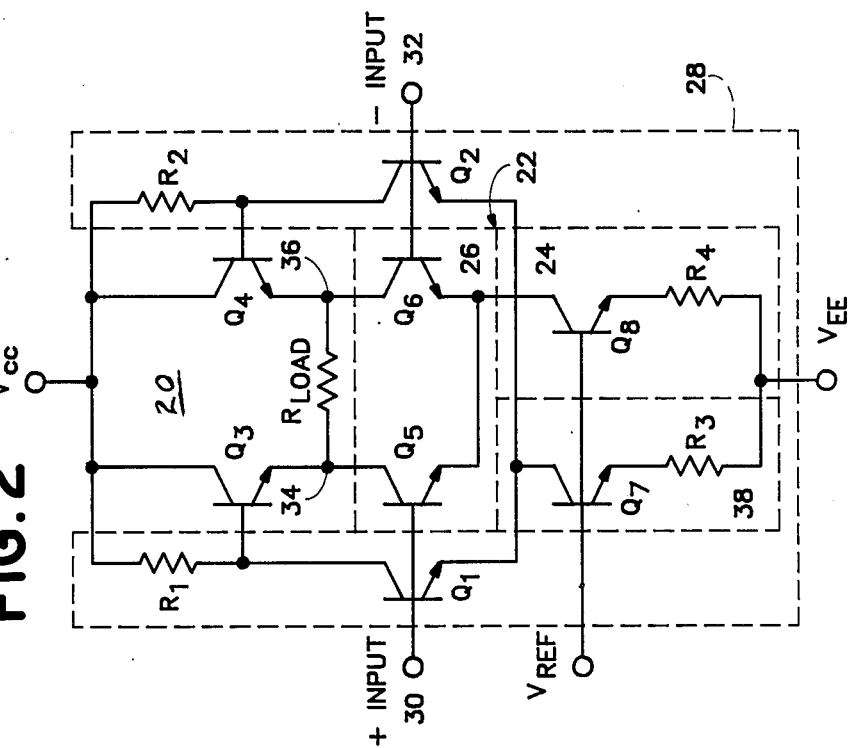
FIG. 2
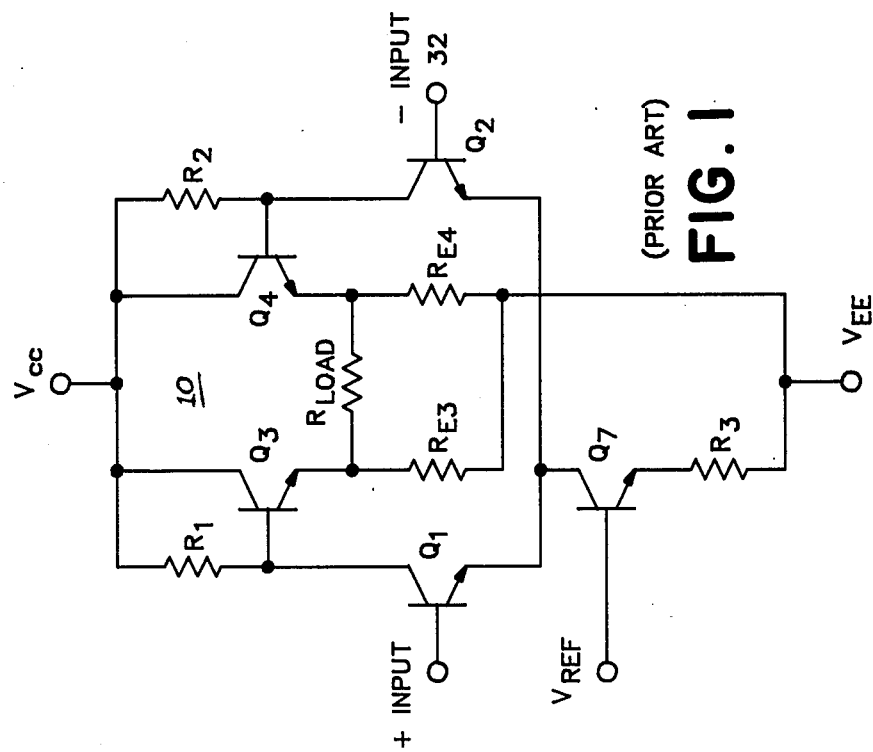
FIG. I (PRIOR ART)

4,795,916

LOW POWER DIFFERENTIAL ECL LINE DRIVER

BACKGROUND OF THE INVENTION

The present invention relates to electronic differential line drivers and particularly to low power ECL, or emitter coupled logic, line drivers used to drive a predetermined amount of electrical power through a line or load. The present invention further relates to differential ECL line drivers operating with relatively high efficiency particularly useful in high density, monolithic switching circuitry.

Conventional differential ECL line drivers employ emitter resistors in each side of the amplifier. Such amplifiers are not efficient because power is consumed in both emitter resistors at all times even though power is only required on one side at a time. In circuitry in which only a small number of differential line drivers are used, the power consumed may not be of great importance, but in high density monolithic applications or large systems in which many such line drivers are used, any demonstrable improvement in power efficiency is important.

Therefore, what is desired is a differential ECL line driver configuration in which the power consumption is minimized.

SUMMARY OF THE INVENTION

Accordingly, the present invention provides a differential ECL line driver configuration in which there is effectively only one output transistor emitter load electronically switched from one amplifier side to the other as required by the operation of the circuitry.

The objects, advantages and other novel features of the present invention will be apparent from the following detailed description when read in conjunction with the appended claims and attached drawings.

BRIEF DESCRIPTION OF THE DRAWINGS

FIG. 1 is a schematic representation of a differential ECL line driver in accordance with the prior art.

FIG. 2 is a schematic representation of a low power, differential ECL line driver in accordance with the present invention.

DETAILED DESCRIPTION OF THE PREFERRED EMBODIMENT

Referring now to FIG. 1, conventional differential ECL line driver 10 in accordance with prior art practice includes output transistors Q3 and Q4 used to drive a predetermined amount of power through a line, represented as load resistor RLOAD. Line driver 10 is a differential line driver, or amplifier, in that a pair of transistor amplifiers is used, one amplifier at each side of the output, in a manner and for purposes well known in the art. In a typical configuration, load resistor RLOAD may be one of a large number of 50 ohm output lines used in a digital communication network.

In this conventional differential ECL line driver configuration, output transistors Q3 and Q4 are connected to the emitter power supply, VEE, via emitter resistors RE3 and RE4, respectively, and are directly connected to the collector power supply, VCC. The controlling voltages are applied to the bases of output transistor Q3 and output transistor Q4.

In general, when conventional differential line driver 10 is driven so that output transistor Q3 conducts, output transistor Q4 does not, and vice versa. It is, however, desirable to have the non-conducting transistor actually conduct a small amount of current, the so-called "keep-alive" current, to maintain the transistor in its operating zone so that indeterminate high impedance output conditions are avoided.

When output transistor Q3 conducts, the current through emitter resistor RE4 equals the current through load resistor RLOAD plus the keep-alive current required through output transistor Q4. In this state, emitter resistor RE3 is not needed, but is included in this conventional configuration because it is required in the other state when output transistor Q4 conducts. The power consumed by emitter resistor RE3, when output transistor Q3 conducts, is wasted.

Similarly, when output transistor Q4 conducts, the current through emitter resistor RE3 equals the current through load resistor RLOAD plus the keep-alive current required through output transistor Q3. In this state, emitter resistor RE4 is not needed, but it must be included in this configuration because it is required when output transistor Q3 conducts. The power consumed by emitter resistor RE4, when output transistor Q4 conducts, is wasted.

Therefore, in either state, the power consumed in one of the emitter resistors is wasted. In order to improve efficiency by eliminating this waste of power, the present invention provides, in effect, a single emitter load in the form of a constant current source which is switched between output transistors Q3 and Q4 as required by the state of operation of the line driver.

Referring now to FIG. 2, low power differential ECL line driver 20, in accordance with the present invention, includes output transistors Q3 and Q4 but substitutes switchable emitter load 22 for emitter resistors RE3 and RE4 shown in FIG. 1.

Switchable emitter load 22 includes constant current source 24 comprised of emitter load transistor Q8 and emitter load resistor R4. Constant current source 24 is the replacement for the emitter resistors.

The resistance of emitter load resistor R4 is selected so that when preselected reference voltage VREF is applied to the base of emitter load transistor Q8, the current through emitter load resistor R4 just equals the sum of the load and keep-alive currents. In this manner, constant current source 24 fulfills the function of the required emitter resistor.

Switchable emitter load 22 also includes differential switch 26 which serves to connect constant current source 24 to the emitter of output transistors Q3 or Q4, via load transistors Q5 and Q6, as appropriate. Load transistors Q5 and Q6 are in turn operated by line driver switching network 28 which simultaneously controls the operation of output transistors Q3 and Q4, as described below in greater detail.

When output transistor Q3 conducts, load transistor Q5 does not conduct but load transistor Q6 does conduct and serves to connect positive output 36 at the emitter of output transistor Q4 to VEE through constant current source 24. Similarly, when output transistor Q4 conducts, load transistor Q6 does not but load transistor Q5 does conduct and serves to connect negative output 34 at the emitter of output transistor Q3 to VEE through constant current source 24.

In this way it can be clearly seen that emitter load resistor power is not wasted, because no unnecessary emitter resistance is provided for the emitter of the conducting output transistor. All the emitter current of the conducting output transistor is applied to the load.

The operation of line driver switching network 28 will now be discussed in greater detail. Within line driver switching network 28, the positive input signal to low power differential ECL line driver 20 is applied to positive input 30 at the base of switch transistor Q1. Similarly, the negative input signal is applied to negative input 32 at the base of switch transistor Q2. Single ended operation is easily achieved by connecting either input to a stable voltage reference which serves as the input switching threshold voltage.

The operation of this circuit is analyzed in two states. In the first state, the signal applied to positive input 30 is more positive than the input signal applied to negative input 32. Switch transistor Q1 conducts and switch transistor Q2 does not. The voltage drop across resistor R1 is applied to the base of output transistor Q3. The voltage applied to load resistor RLOAD at negative output 34 in this state is called VOL, that is voltage-output-low, and is equal to the drop across resistor R1 less VBE, the base to emitter voltage drop.

Similarly, the voltage drop across resistor R2 is applied to the base of output transistor Q4. The voltage applied to load resistor RLOAD at positive output 36 in this state is VOH, that is voltage-output-high, and is equal to VCC less VBE.

The current through resistor R1 in this state is provided by current source 38 formed within line driver switching network 28 by transistor Q7 and load resistor R3. VREF is applied to the base of transistor Q7.

The bases of load transistor Q5 and Q6 are connected to the bases of switch transistor Q1 and Q2, respectively. Therefore, in this first state, load transistor Q5 conducts, connecting constant current source 24 to the emitter of output transistor Q3. Load transistor Q6 does not conduct in this state so that constant current source 24 is not connected to the emitter of output transistor Q4.

The operation of line driver switching network 28 in the second state, in which the input signal to positive input 30 is less positive than the input signal to negative input 32, can be understood from the symmetry of the circuit.

In this state, switch transistor Q2 and load transistor Q6 conduct while switch transistor Q1 and load transistor Q5 do not. No current flows through resistor R1 and the current through resistor R2 is provided by current source 38 via switch transistor Q2. Constant current source 24 is applied to the emitter of output transistor Q4 via load transistor Q6. VOL therefore appears at positive output 36 while VOH appears at negative output 34.

In this manner it can be seen that line driver switching network 28 controls output transistors Q3 and Q4 as well as switchable emitter load 22 to minimize power consumption and maximize efficiency.

What is claimed is:

1. A low power differential line driver comprising:
   a pair of output transistors having a load connected between their outputs so that one of the output transistors provides a load current for the load and other transistor maintains a "keep alive" current;
   means coupled to the output transistors for controlling the operation of the output transistors in response to a differential input signal;
   a constant current source coupled to the output transistors as a common emitter load; and
   means coupled between the constant current source and the output transistors for switching the constant current source to the emitter of the other output transistor, the constant current source providing both the load current and the "keep alive" current.

2. The differential line driver of claim 1 wherein the controlling means is coupled in parallel to the switching means to simultaneously control the operation of the switching means and the output transistors in response to the differential input signal.

3. A method for efficiently applying a differential output to a line comprising the steps of:
   controlling the operation of a pair of output transistors connected across the line in response to a differential input signal so that one output transistor provides a load current for the line while the other transistor maintains a "keep alive" current;
   providing a constant current source as a common emitter load for the output transistors; and
   switching the constant current source to the emitter of the other output transistor, the constant current source providing both the load current and the "keep alive" current.

4. The method of claim 3 wherein the controlling and switching steps are performed simultaneously in response to the differential input signal.

5. An improved differential line driver of the type having a pair of output transistors being connected across an output load with one output transistor providing a load current for the output load while the other output transistor maintains a "keep alive" current, having a differential input amplifier coupled to drive the output transistors, and having a current source coupled to bias the differential input amplifier, the improvement comprising:
   a constant current source coupled to the output transistors as a common emitter load; and
   means coupled between the constant current source and the output transistors for switching the constant current source between output transistors as the emitter load for the other output transistor, the constant current source providing the load current and the "keep alive" current.

6. An improved differential line driver as recited in claim 5 wherein the switching means is connected in parallel with the differential input amplifier such that a differential input signal is applied to the differential input amplifier and to the switching means simultaneously.

* * * * *